(12) United States Patent
Ambilkar et al.

(10) Patent No.: US 6,670,823 B2
(45) Date of Patent: Dec. 30, 2003

(54) DETECTING COUNTER CONTENTS FOR TIME-CRITICAL APPLICATIONS

(75) Inventors: Shridhar N Ambilkar, Bangalore (IN); Ashutosh Misra, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/090,135

(22) Filed: Feb. 27, 2002

(65) Prior Publication Data

US 2003/0160631 A1 Aug. 28, 2003

(51) Int. Cl.[7] ............................................. H03K 19/173
(52) U.S. Cl. ................. 326/37; 326/46; 326/9; 326/14
(58) Field of Search .................. 376/9, 11, 12, 376/14, 16, 37, 46, 38

(56) References Cited

U.S. PATENT DOCUMENTS 4,773,067 A  * 9/1988 Buxbury et al. ....... 340/825.01

* cited by examiner

*Primary Examiner*—Anh Tran
(74) *Attorney, Agent, or Firm*—Manny Schecter; T. Rao Coca; Anthony V. S. England

(57) ABSTRACT

An additional bit is used in a binary register for detecting register contents in timing and counting applications. A predetermined timing or counting event occurs when the additional bit changes logical states. In one implementation, an additional bit is provided in the most significant bit (MSB) position in a binary register, and is initially set to a logical zero state. When the values in the binary register decrement to zero, the additional (MSB) bit changes logic states to a logical one state, when the zero value in the binary register is decremented in the next clock cycle. A determination is consequently made that the binary register has reached zero.

12 Claims, 4 Drawing Sheets

DETECTING COUNTER CONTENTS FOR TIME-CRITICAL APPLICATIONS

FIELD OF THE INVENTION

The present invention relates to detecting counter contents in a register-based counters used for time-critical applications.

BACKGROUND

Various applications use register-based counters or "timers", to determine timing. For control applications, there is a need to check when the counter reaches zero. An existing technique for detecting when a counter reaches zero involves performing a bit-wise logical OR operation. In a typical implementation, a counter is loaded with a non-zero value and triggered by a control signal to decrement the counter contents every clock cycle.

FIG. 1 schematically represents a cascaded arrangement of two-input OR gates 66 that can be used to detect a logical zero state for an 8-bit counter. The series of gates in FIG. 1 comprises 7 two-input OR gates divided into 3 stages (stages 1, 2 and 3, as indicated in FIG. 1). A corresponding series of OR gates for an n–bit register requires (n–1) two input OR gates.

However, the OR-gate arrangement of FIG. 1 can cause timing violations when large counter sizes are used at high frequency. This is because the number of bits involved in the logical OR operations are correspondingly greater. The number of stages of OR gates required is the binary logarithm of the number of bits subject of the OR operation, assuming standard two-bit input OR gates are used. That is, $\log_2 n$ stages of OR gates are required, where n represents the number of bits subject of the OR operation. Once the input at stage 1 OR gates is stable, the total time taken to detect that all bits are zero is the sum of the propagation delays of each OR-gate stage, plus associated wire delays for each stage (that is, T1+T2+T3).

Typically, wire delays are a function of output loading and input transition time. Wire delays are generally becoming more significant because, while transistors are becoming smaller, integrated circuits are getting bigger. Wire delays are primarily due to resistance-capacitance effects. So, In new technologies also the overall delay (T1+T2+T3) is significant in timing critical applications.

FIG. 2 schematically represents an example of detecting a 16-bit binary register reaching zero. The register is loaded with a 16-bit count value. A "decrement" operation is performed every clock cycle. Once the counter expires, a bit-wise OR operation on all 16 bits stored in the binary register helps to generate the control signal. The bit-wise OR operation requires a series of OR gates similar to the arrangement of FIG. 1. In this case, however, 15 two-input OR gates are required in 4 stages for the arrangement of FIG. 2.

As the counter depth increases, the number of bits involved in the OR operation increases. Consequently, the number of required two-input OR gate stages correspondingly increases, according to the relation noted above. This increase in the number of gates and can cause an undesirable delay in recognising the zero condition. This delay can be particularly undescribed in high-frequency time-critical systems.

In view of the above observations, a need clearly exists for alternative techniques for detecting counter content reaching zero in a timing critical applications.

SUMMARY

An improved technique for detecting when a counter reaches a zero condition can be implemented as an alternative to existing logical OR-based techniques such as those described with reference to FIGS. 1 and 2.

The described technique is implemented independent of register/counter depth. The same approach can also be used to detect when a counter reaches an upper limit, for incremental (rather than decremental) counter operation.

DETAILED DESCRIPTION

Figure 3:
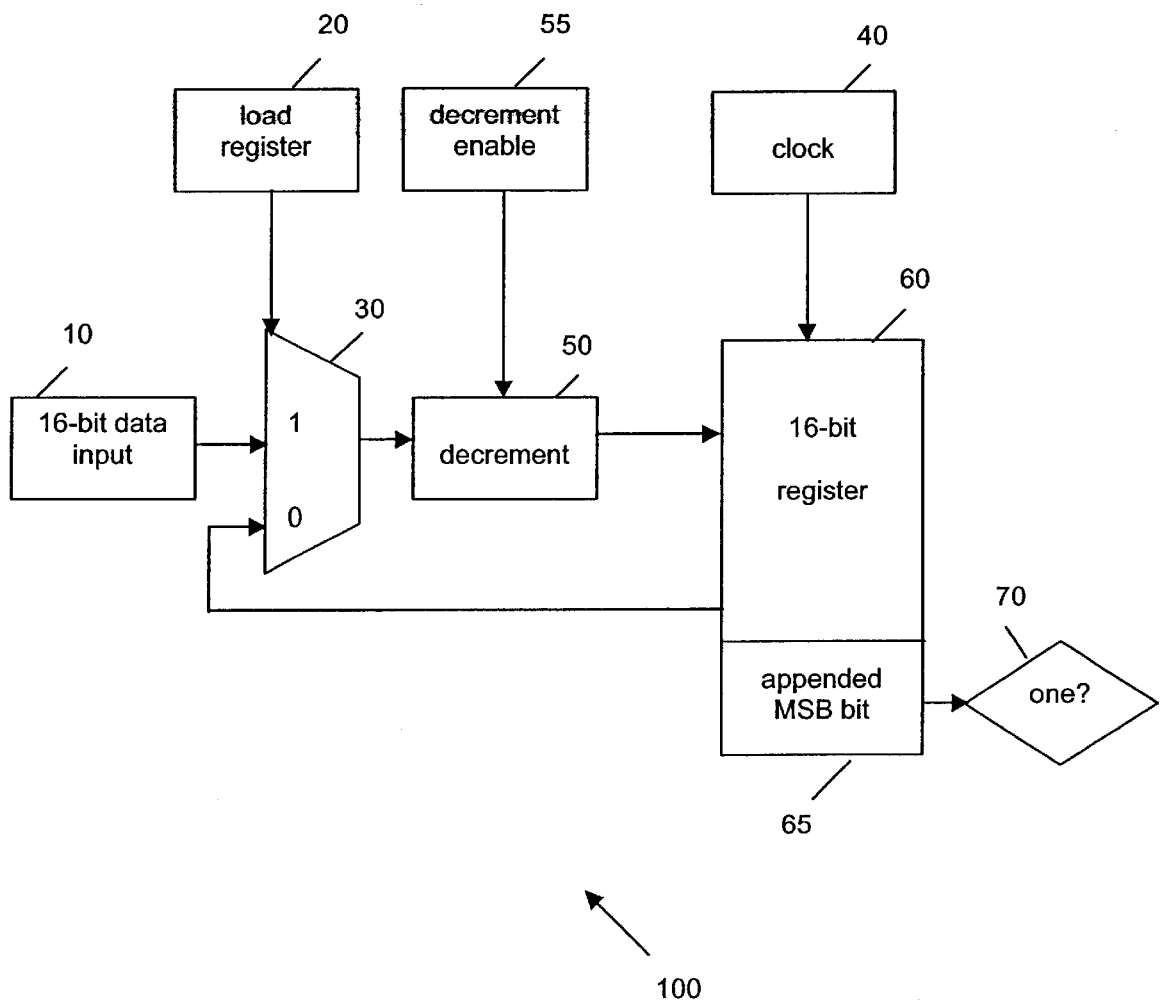
FIG. 3 is a schematic representation of an arrangement, alternative to the arrangement of FIG. 1, detecting when a counter reaches zero.
Figure 4:
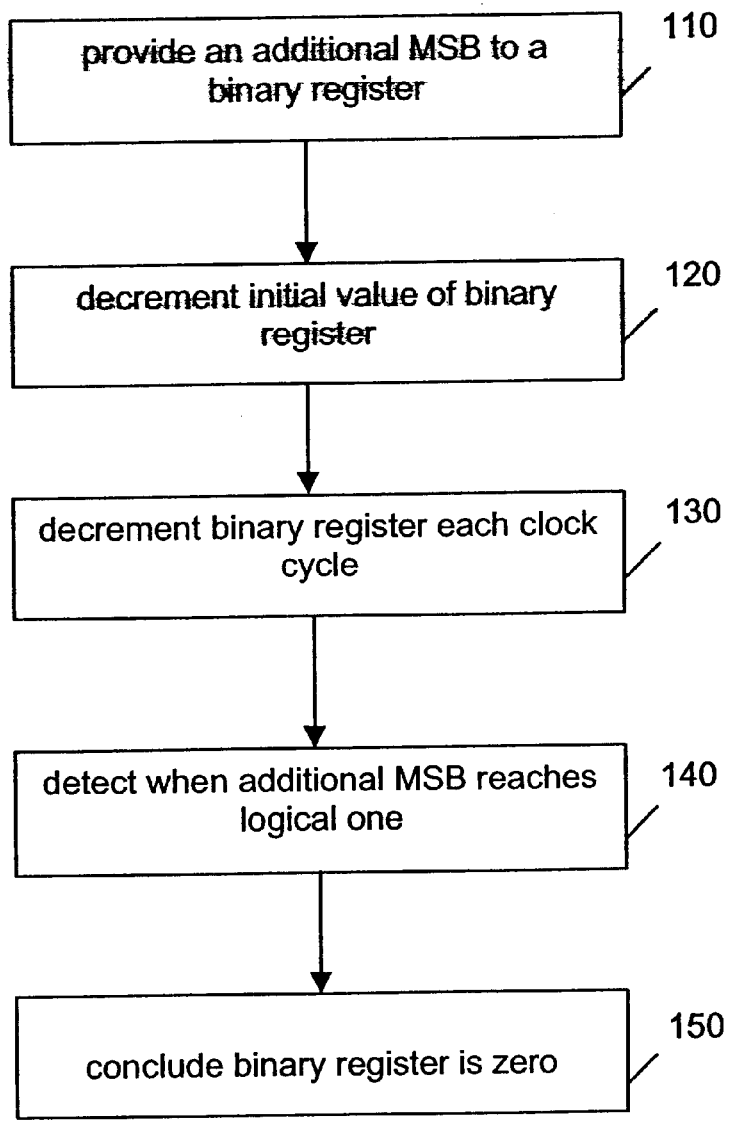
FIG. 4 is a flowchart of the steps involved in using the arrangement of FIG. 3.

An implementation of techniques for detecting "zero" in a binary register is described herein with reference to FIGS. 3 and 4.

FIG. 3 schematically represents a digital logic arrangement suitable for use in timer or counting applications. A 16-bit binary data input 10 provides data to a digital multiplexer 30. The digital multiplexer 30 input is selected by load register 20. The output of digital multiplexer 30 inputs to decrement logic 50, which is triggered by a decrement enable 55. A 16-bit register 60 is supplemented by an appended MSB bit 65. The appended MSB bit 65 is initialized to a logical zero state. Clock 40 drives the 16-bit register 60. The output of the 16-bit 60 is input to the digital multiplexer 30. The appended bit 65 is input to binary logic 70, to determine whether the 16-bit register 70 has reached zero.

As indicated in FIG. 3, an additional "extra" bit is appended to the binary register in the MSB (most significant bit) position. While loading the counter value into the binary register, the load value is passed through the existing decrement logic. The appended bit 65 is provided using a single flip-flop/register bit that supplements the 16-bit register 70.

Figure 2:
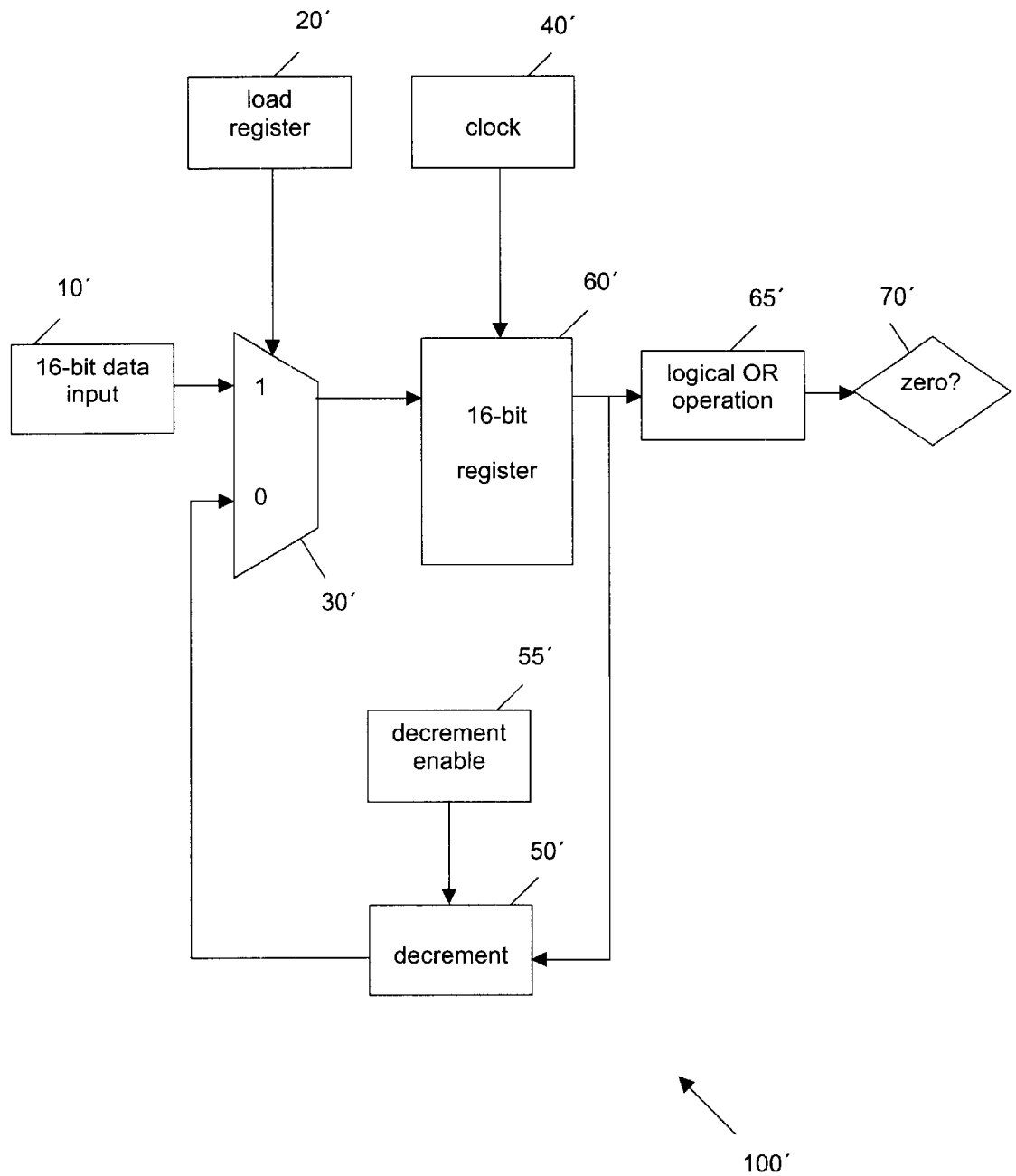
FIG. 2 is a schematic representation of an existing arrangement for detecting when a counter reaches zero.

The initial value of the binary register is one "count" less than the original value of the register, for the corresponding existing implementation of FIG. 2. The decrement operation starts with the valid control signal and continues for one extra operation after reaching zero, to compensate for the initial value, which was one count value less than the original count value. Accordingly, the MSB bit is set to 1 in the cycle immediately after the counter reaches zero.

The arrangement of FIG. 3 detects when the contents of the 16-bit register 60 reaches zero. The OR gate stages are removed, compared with FIG. 2, and an extra bit is appended at the MSB position of the 16-bit register 60. Correspondingly, the 16-bit input is also appended with 1 extra bit at the MSB position.

Consider the following example for FIG. 3, involving a register loaded with a value of 9. The initial value of 9 is represented with a binary bit pattern of 0 . . . 1001. The ellipsis in this binary bit pattern represents zeroes between the most significant bit (that is, 0) on the left-hand side of the bit pattern, and the least significant bits (that is, 1001) of the right-hand side of the bit pattern. The actual bit pattern loaded in the register is 8 (that is, 0 . . . 1000) due to the decrement logic 50. A decrement operation is initiated by decrement enable 55 each clock cycle, and continues for an extra cycle after reaching zero. The sequence of bit patterns is as follows in Table 1.

TABLE 1

| initial value | 0 . . . 1000 |
|---|---|
| value after first clock cycle | 0 . . . 0111 |
| value after second clock cycle | 0 . . . 0110 |
| value after third clock cycle | 0 . . . 0101 |
| value after fourth clock cycle | 0 . . . 0100 |
| value after fifth clock cycle | 0 . . . 0011 |
| value after sixth clock cycle | 0 . . . 0010 |
| value after seventh clock cycle | 0 . . . 0001 |
| value after eighth clock cycle | 0 . . . 0000 |
| value after ninth clock cycle | 1 . . . 1111 |

The extra MSB bit is the bit at the left-hand side of the successive bit patterns listed in Table 1. Instead of counting from 9 to 0 as in the arrangement of FIG. 2, counting proceeds from 8 to 0 and then to bit values that are all logical one. The total number of decrement operations is the same in both cases. The ellipsis represents logical zero bits for all bit patterns, except in the last-listed bit pattern in which the ellipsis represents logical one bits.

Figure 1:
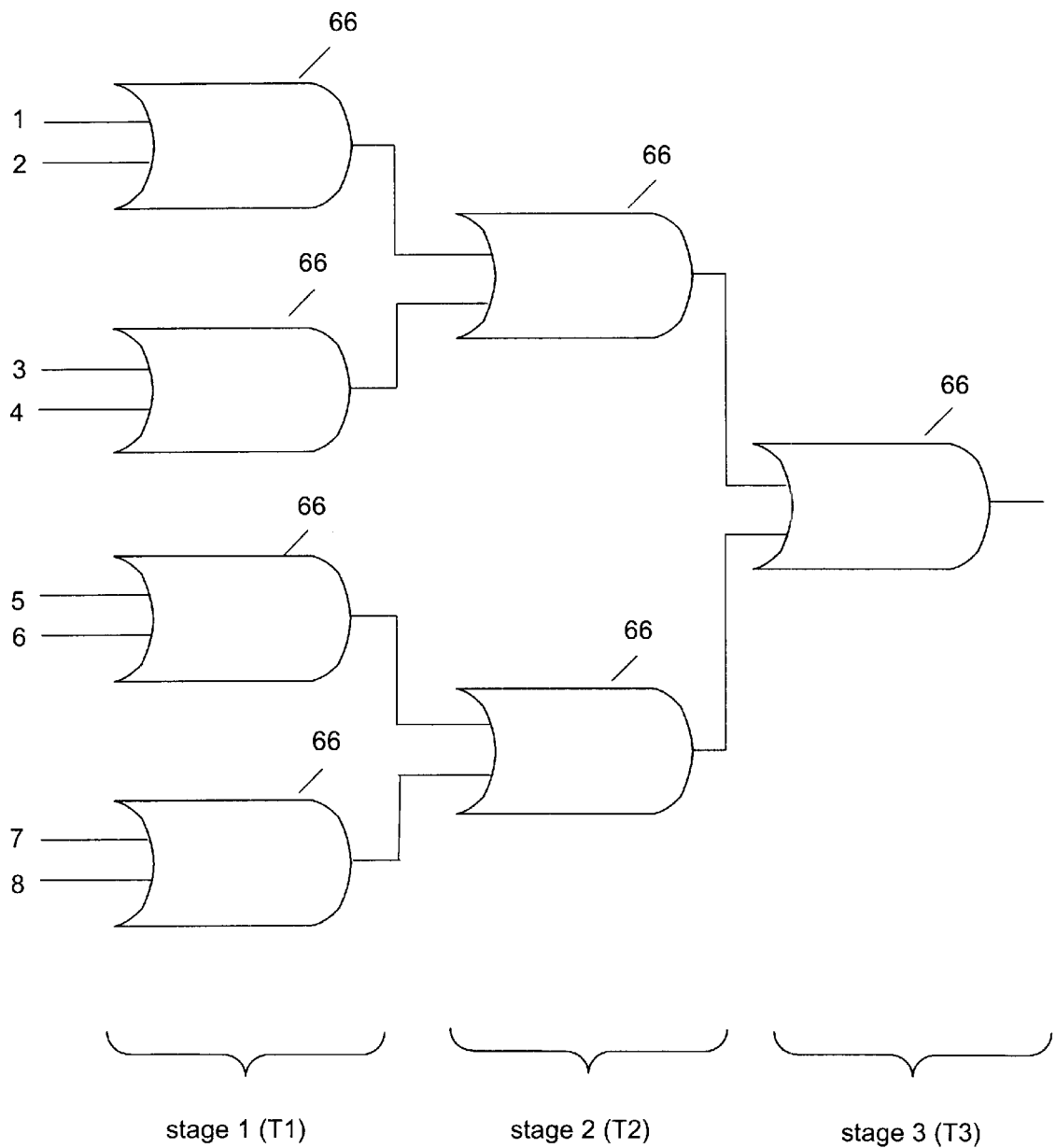
FIG. 1 is a schematic representation of an existing series of OR gates that can be used to detect whether a bit pattern is logical zero.

The 16-bit data input is passed through decrement logic while loading, so that the register has one count less than a regular counter, such as the existing counter of FIG. 1. Once the decrement operation starts, the operation continues until the register reaches zero plus one more cycle to compensate for the initial load value, which was one less than the original count. This extra decrement cycle changes the value of appended bit in the register to high (that is, logical one or "true"), to indicate that the counter is zero.

The output result is valid independent of counter depth. The arrangement of FIG. 3 has a full clock period to detect the zero condition.

FIG. 4 is flowchart of steps involved in using the digital logic of FIG. 3. In step 110, an additional MSB 65 is provided to the binary register 60.

In step 120, the initial value of the binary register 60 is decremented. In step 130, the value of the binary register 60 is decremented each clock cycle. In step 140, the additional MSB 65 reaches logic one, once the value of the binary register 60 reaches logic zero, and is decremented in the next clock cycle. In step 150, a conclusion is made that the binary register 60 reaches zero, once the additional MSB 65 is detected as logical one, in step 140.

Conclusion

Digital logic, and associated techniques for using this digital logic, are described herein for implementing improved register-based timing or counting techniques.

Other implementations are possible. For example, an implementation can be provided with an incremental rather than a decremental operation existing incremental operation provides. With reference to FIG. 2, logical AND operations rather than logical OR operations. Further, increment operations replace decrement operations in relation to counter values. Analogous changes can be made to the arrangement depicted in and described with reference to FIG. 3, to provide an arrangement suitable for detecting when a counter reaches a predetermined upper limit.

Various other alterations and modifications can be made to the techniques and arrangements described herein, as would be apparent to one skilled in the relevant art.

We claim:

1. A method for determining when a register value has counted down to a zero condition, the method comprising the steps of:

storing a value for an N-bit data input in a binary register, wherein the data input has a certain value and the register has N+1 bits, the N+1 bits including N bits and an extra bit;

repetitively decrementing the value stored in said binary register's N+1 bits;

detecting a value of said extra bit; and determining when the value of said extra bit changes.

2. The method as claimed in claim 1, wherein said extra bit is the MSB (most significant bit) of the binary register.

3. The method as claimed in claim 1, wherein the method comprises the steps of:

initializing a value stored by said extra bit to logical zero, and wherein determining when the value of said extra bit changes includes:

determining when a value of the extra bit changes to logical one.

4. The method as claimed in claim 1, wherein the decrementing of the value stored by said binary register includes periodically decremented the register value each cycle of a clock, the clock being used in conjunction with said binary register.

5. Digital logic arrangement to detect when a binary register reaches zero, the digital logic comprising:

a binary register for storing a value for an N-bit data input, the data input having a certain value and the register having N+1 bits, the N+1 bits including N bits and an extra bit;

decrementing means, for repetitively decrementing the value stored in said binary register's N+1 bits; and means for detecting a value of said extra bit of said value stored by said binary register and determining when the value of said extra bit changes.

6. The digital logic arrangement of claim 5, wherein said extra bit is the MSB (most significant bit) of the binary register.

7. The digital logic arrangement of claim 5, wherein said digital logic includes:

means for initializing a value stored by said extra bit to logical zero, and said determining means includes means for determining when a value of the extra bit changes to logical one.

8. The digital logic arrangement of claim 5, wherein said decrementing means includes means for periodically decrementing the register value each cycle of a clock, the clock being used in conjunction with said binary register.

9. Digital logic arrangement to detect when a binary register reaches zero, the digital logic comprising:

a binary register for storing a value for an N-bit data input, the data input having a certain value and the register having N+1 bits, the N+1 bits including N bits and an extra bit;

decrement logic having an output coupled to the binary register;

a multiplexer having an input coupled to receive the N-bit data input and an output coupled to the decrement logic, for passing the value of the data input through the decrement logic while loading the binary register, so that the N bits of the binary register are initialized to a value one less than the certain value of the data input, wherein the decrement logic is operable for repetitively decrementing the value stored in said binary register's N+1 bits; and a detector for detecting a value of said extra bit, and determining when the value of the extra bit changes logic states.

10. The digital logic arrangement of claim 9, wherein said extra bit is the MSB (most significant bit) of the binary register.

11. The digital logic arrangement of claim 9, wherein a value stored by said extra bit is initially set to logical zero and changes to logical one.

12. The digital logic arrangement of claim 9, wherein the repetitive decrementing of the decrement logic occurs periodically responsive to cycles of a clock, the clock being used in conjunction with said binary register.

* * * * *